US009824621B2

(12) United States Patent
Xiao et al.

(10) Patent No.: US 9,824,621 B2
(45) Date of Patent: Nov. 21, 2017

(54) GATE DRIVE CIRCUIT AND DISPLAY DEVICE

(71) Applicants: Shenzhen China Star Optoelectronics Technology Co., Ltd., Shenzhen, Guangdong (CN); Wuhan China Star Optoelectronics Technology Co., Ltd., Wuhan, Hubei (CN)

(72) Inventors: Juncheng Xiao, Guangdong (CN); Mang Zhao, Guangdong (CN)

(73) Assignees: Shenzhen China Star Optoelectronics Technology Co., Ltd., Shenzhen, Guangdong (CN); Wuhan China Star Optoelectronics Technology Co., Ltd., Wuhan, Hubei (CN)

( * ) Notice: Subject to any disclaimer, the term of this patent is extended or adjusted under 35 U.S.C. 154(b) by 0 days.

(21) Appl. No.: 14/778,281

(22) PCT Filed: Apr. 3, 2015

(86) PCT No.: PCT/CN2015/075840
§ 371 (c)(1),
(2) Date: Dec. 30, 2015

(87) PCT Pub. No.: WO2016/145691
PCT Pub. Date: Sep. 22, 2016

(65) Prior Publication Data
US 2017/0103698 A1    Apr. 13, 2017

(30) Foreign Application Priority Data

Mar. 17, 2015   (CN) .......................... 2015 1 0116871

(51) Int. Cl.
*G09G 3/20*      (2006.01)
*G09G 3/3266*    (2016.01)
(Continued)

(52) U.S. Cl.
CPC ......... *G09G 3/2085* (2013.01); *G09G 3/3266* (2013.01); *G09G 3/3674* (2013.01);
(Continued)

(58) Field of Classification Search
CPC .. G09G 3/2085; G09G 3/3266; G09G 3/3674; G09G 2310/0243; G09G 2310/0286; G09G 2310/08; G11C 19/28
See application file for complete search history.

(56) References Cited

U.S. PATENT DOCUMENTS

| 2006/0017685 A1 | 1/2006 | Tseng et al. |
| 2014/0145921 A1* | 5/2014 | Imai ..................... G09G 3/3688 345/87 |

FOREIGN PATENT DOCUMENTS

| CN | 101178879 | 5/2008 |
| CN | 101477836 | 7/2009 |

(Continued)

OTHER PUBLICATIONS

Search Report and Written Opinion dated Dec. 4, 2015, in International Patent Application No. PCT/CN2015/075840.

*Primary Examiner* — Charles Hicks
(74) *Attorney, Agent, or Firm* — Kim Winston LLP

(57) ABSTRACT

A gate drive circuit and a display device are provided. The present disclosure pertains to the technical field of display technology and solves the technical problem of wide frame of the existing display device. The shifting register is configured to output primary drive signal into a first follower and a second follower in consecutive first scanning period t1 and second scanning period t2. The first follower is configured to output gate drive signal to a first gate line in t1 under the driving of the primary drive signal; and the second follower is configured to output the gate drive signal to a second gate line in t2 under the driving of the primary drive
(Continued)

Figure 1:
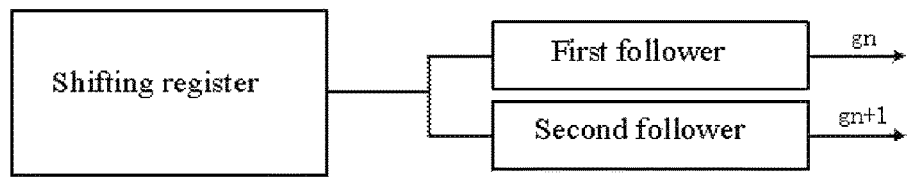

signal. The present disclosure can be applied to display devices, such as liquid crystal display devices and OLED display devices, and the like.

14 Claims, 5 Drawing Sheets

(51) Int. Cl.
*G09G 3/36* (2006.01)
*G11C 19/28* (2006.01)

(52) U.S. Cl.
CPC ..... *G11C 19/28* (2013.01); *G09G 2310/0243* (2013.01); *G09G 2310/0286* (2013.01); *G09G 2310/08* (2013.01)

(56) References Cited

FOREIGN PATENT DOCUMENTS

| | | |
|---|---|---|
| CN | 102290040 | 12/2011 |
| CN | 202196566 | 4/2012 |
| CN | 102831873 | 12/2012 |
| CN | 103236272 | 8/2013 |
| CN | 104409054 | 3/2015 |
| CN | 104464663 | 3/2015 |

* cited by examiner

GATE DRIVE CIRCUIT AND DISPLAY DEVICE

The present application claims the priority of Chinese patent application CN201510116871.4, entitled "A Gate Drive Circuit and A Display Device" and filed on Mar. 17, 2015, the entirety of which is incorporated herein by reference.

TECHNICAL FIELD

The present disclosure relates to the technical field of display, and in particular, to a gate drive circuit and a display device.

TECHNICAL BACKGROUND

With the development of display technology, active display devices, such as liquid crystal display (LCD) device and organic light emitting diode (OLED) display device, have been used more and more in various fields.

In a traditional active display device, a gate line is mainly driven by a driver chip externally attached to an array substrate. The driver chip can control gradual charging and discharging of the gate lines. However, at present, gate driver on array (GOA) technology has been applied more and more. According to the GOA technology, a gate drive circuit is formed on the array substrate, thereby realizing progressive scanning of gate lines. In this case, the gate drive circuit for replacing the traditional external driver chip can be formed in a peripheral region of the array substrate by means of the original manufacturing procedure of the array substrate. A bonding procedure of the driver chip can be omitted according to the GOA technology, whereby the productivity can be increased, the production cost can be reduced, and a width of a frame of the display device can be reduced.

However, in today's trend for smaller and lighter display device, the frame of the existing display device is still quite large, which can hardly meet the demand for narrow frame.

SUMMARY OF THE INVENTION

The object of the present disclosure is to provide a gate drive circuit and a display device for solving the technical problem of large width of the frame of a display device in the prior art.

The present disclosure provides a gate drive circuit, comprising a shifting register, a first follower and a second follower, wherein, the shifting register is configured to output primary drive signal to the first and the second followers in consecutive first scanning period and second scanning period. The first follower is configured to be driven by the primary drive signal to output a gate drive signal to a first gate line in the first scanning period; and the second follower is configured to be driven by the primary drive signal to output the gate drive signal to a second gate line in the second scanning period.

Further, the shifting register comprises a latch and an NAND gate circuit, wherein the latch is configured to receive a first trigger signal and output a second trigger signal before the first and the second scanning periods start, and continuously output the second trigger signal in the first and the second scanning periods, and the NAND gate circuit is configured to be driven by the second trigger signal to output the primary drive signal.

Preferably, to the latch is connected a first primary clock signal line and to the NAND gate circuit is connected a second primary clock signal line; and the first primary clock signal line and the second primary clock signal line both output pulse signals having a phase difference of 180° therebetween.

Preferably, the latch comprises NMOS transistors T9, T10, T11, T12, T13, and T14 and PMOS transistors T4, T5, T7, T8, T15, and T16, wherein gates of T7, T10, T13, and T15 are connected to the first primary clock signal line, gates of T4 and T9 are connected to a first trigger signal end, and gates of T8 and T12 are connected to an output end of the latch; a source of T13 is connected to a low level signal line, a source of T15 is connected to a high level signal line, and drains of T13 and T15 are connected to gates of T5 and T11 respectively; sources of T4 and T8 are connected to the high level signal line, a drain of T4 is connected to a source of T5, and a drain of T8 is connected to a source of T7; sources of T9 and T12 are connected to the low level signal line, a drain of T9 is connected to a source of T10, and a drain of T12 is connected to a source of T11; drains of T5, T7, T10, and T11 are connected to gates of T14 and T16 respectively; and a source of T14 is connected to the low level signal line, a source of T16 is connected to the high level signal line, and drains of T14 and T16 are connected together as the output end of the latch.

Preferably, the NAND gate circuit comprises NMOS transistors T41 and T42, and PMOS transistors T39 and T40, wherein gates of T39 and T41 are connected to the second primary clock signal line, and gates of T40 and T42 are connected to the output end of the latch; a source of T42 is connected to the low level signal line, a drain of T42 is connected to a source of T41, and a drain of T41 acts as an output end of the NAND gate circuit; and sources of T39 and T40 are connected to the high level signal line, and drains of T39 and T40 are connected to the drain of T41.

Further, the shifting register further comprises an inverter having NMOS transistor T38 and PMOS transistor T37, wherein gates of T37 and T38 are connected to the output end of the NAND gate circuit, a source of T37 is connected to the high level signal line, a source of T38 is connected to the low level signal line, and drains of T37 and T38 are connected together as an output end of the shifting register.

Further, the shifting register further comprises a forward and reverse selective circuit.

Preferably, the forward and reverse selective circuit comprises NMOS transistors T1 and T3, and PMOS transistors T0 and T2, wherein gates of T1 and T2 are connected to a forward scan signal line, and gates of T0 and T3 are connected to a reverse scan signal line; sources of T0 and T1 are connected to the output end of a previous stage of shifting register or a forward trigger signal line, and sources of T2 and T3 are connected to the output end of a subsequent stage of shifting register or a reverse trigger signal line; and drains of T0, T1, T2 and T3 are connected together as an output end of the forward and reverse selective circuit.

Further, to the first follower is connected a first secondary clock signal line, and to the second follower is connected a second secondary clock signal line. The first secondary clock signal line is configured to output high level in the first scanning period; and the second secondary clock signal line is configured to output high level in the second scanning period.

Further, the first follower comprises an NAND gate circuit and a buffer, wherein in the first scanning period, the NAND gate circuit performs an NAND operation on the high level outputted from the first secondary clock signal line and the primary drive signal, and outputs low level; and the buffer receives the low level, and outputs the gate drive signal to the first gate line.

Preferably, the NAND gate circuit comprises NMOS transistors T21 and T22, and PMOS transistors T19 and T20, wherein gates of T19 and T21 are connected to the first secondary clock signal line, and gates of T20 and T22 are connected to the output end of the shifting register; a source of T22 is connected to the low level signal line, a drain of T22 is connected to a source of T21, and a drain of T21 acts as an output end of the NAND gate circuit; sources of T19 and T20 are connected to the high level signal line, and drains of T19 and T20 are connected to the drain of T21. The buffer comprises NMOS transistors T18, T24 and T26, and PMOS transistors T17, T23 and T25, wherein gates of T17 and T18 are connected to the output end of the NAND gate circuit, drains of T17 and T18 are connected to gates of T23 and T24, drains of T23 and T24 are connected to gates of T25 and T26, and drains of T25 and T26 are connected to the first gate line; and sources of T17, T23 and T25 are connected to the high level signal line, and sources of T18, T24 and T26 are connected to the low level signal line.

Further, the second follower comprises an NAND gate circuit and a buffer. The NAND gate circuit is configured to perform an NAND operation on the high level outputted from the second secondary clock signal line and the primary drive signal, and outputs low level, in the second scanning period; and the buffer is configured to receive the low level and output the gate drive signal to the second gate line.

Preferably, the NAND gate circuit comprises NMOS transistors T29 and T30, and PMOS transistors T27 and T28, wherein gates of T27 and T29 are connected to the second secondary clock signal line, and gates of T28 and T30 are connected to the output end of the shifting register; a source of T30 is connected to the low level signal line, a drain of T30 is connected to a source of T29, and a drain of T29 acts as an output end of the NAND gate circuit; sources of T27 and T28 are connected to the high level signal line, and drains of T27 and T28 are connected to the drain of T29. The buffer comprises NMOS transistors T32, T34 and T36, and PMOS transistors T31, T33 and T35, wherein gates of T31 and T32 are connected to the output end of the NAND gate circuit, drains of T31 and T32 are connected to gates of T33 and T34, drains of T33 and T34 are connected to gates of T35 and T36, and drains of T35 and T36 are connected to the second gate line; and sources of T31, T33 and T35 are connected to the high level signal line, and sources of T32, T34 and T36 are connected to the low level signal line.

Preferably, the gate drive circuit is a GOA gate drive circuit.

The present disclosure further provides a display device, comprising several cascaded gate drive circuits, wherein the display device performs display by means of interlace driving.

The present disclosure has the following beneficial effects. In the gate drive circuit according to the present disclosure, the shifting register can output primary drive signals in two continuous scanning periods. The first follower and the second follower can respectively output gate drive signals to corresponding gate lines under the drive of the primary drive signal. In this case, one gate drive circuit according to the present disclosure can drive two gate lines. Thus the number of gate drive circuit can be significantly reduced according to the present disclosure as compared with the technical solution in the prior art of driving one gate line with one gate drive circuit, so that the width of a GOA circuit in a frame area of the array substrate can be reduced, whereby the width of a frame of the display device can be reduced.

Other features and advantages of the present disclosure will be further explained in the following description and partially become self-evident therefrom, or be understood through the embodiments of the present disclosure. The objectives and advantages of the present disclosure will be achieved through the structure specifically pointed out in the description, claims, and the accompanying drawings.

BRIEF DESCRIPTION OF THE ACCOMPANYING DRAWINGS

Figure 2:
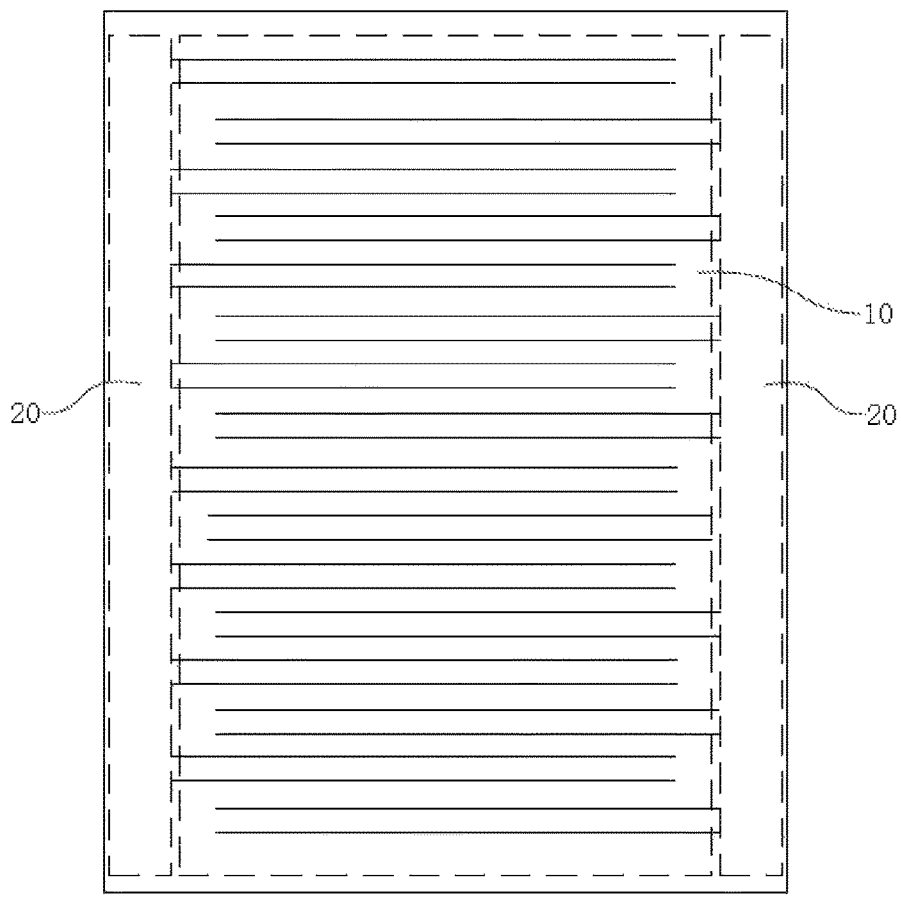
Figure 3:
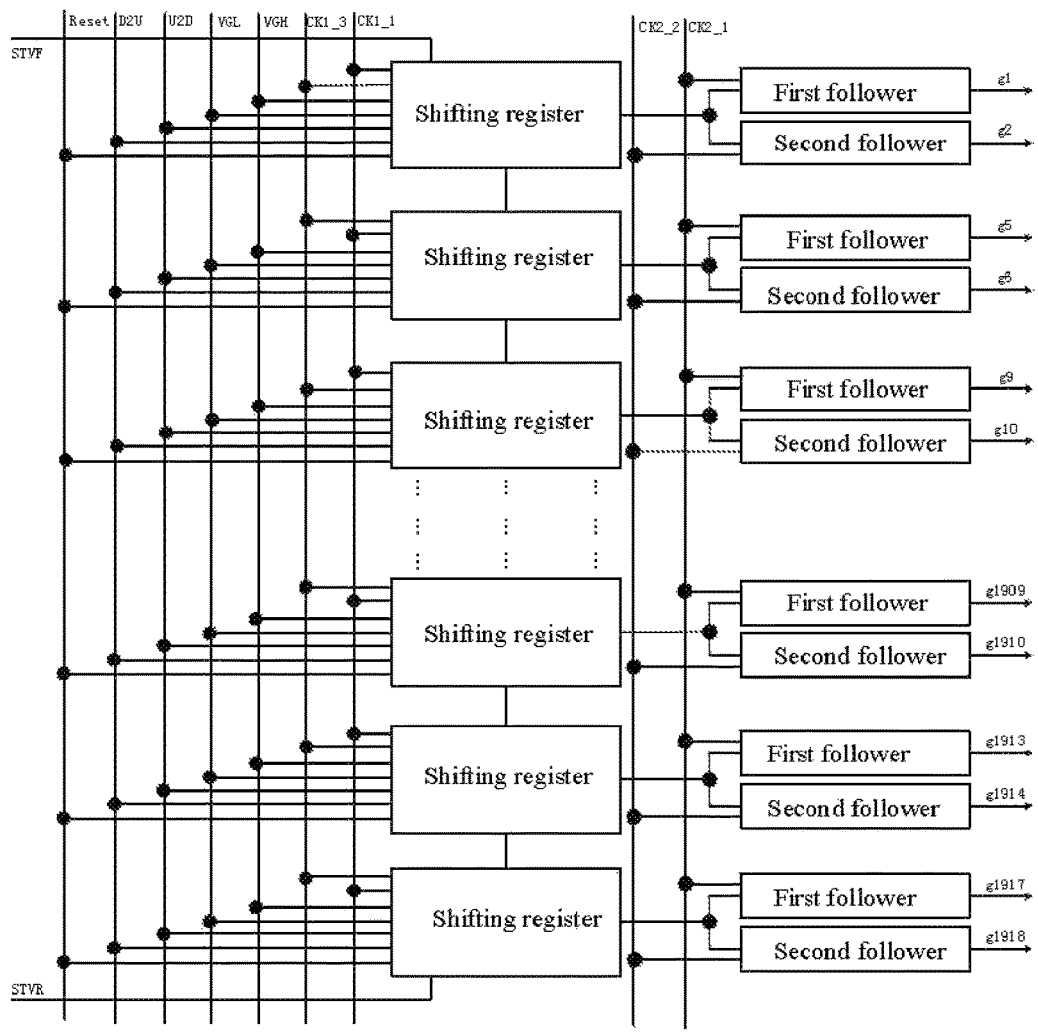
Figure 4:
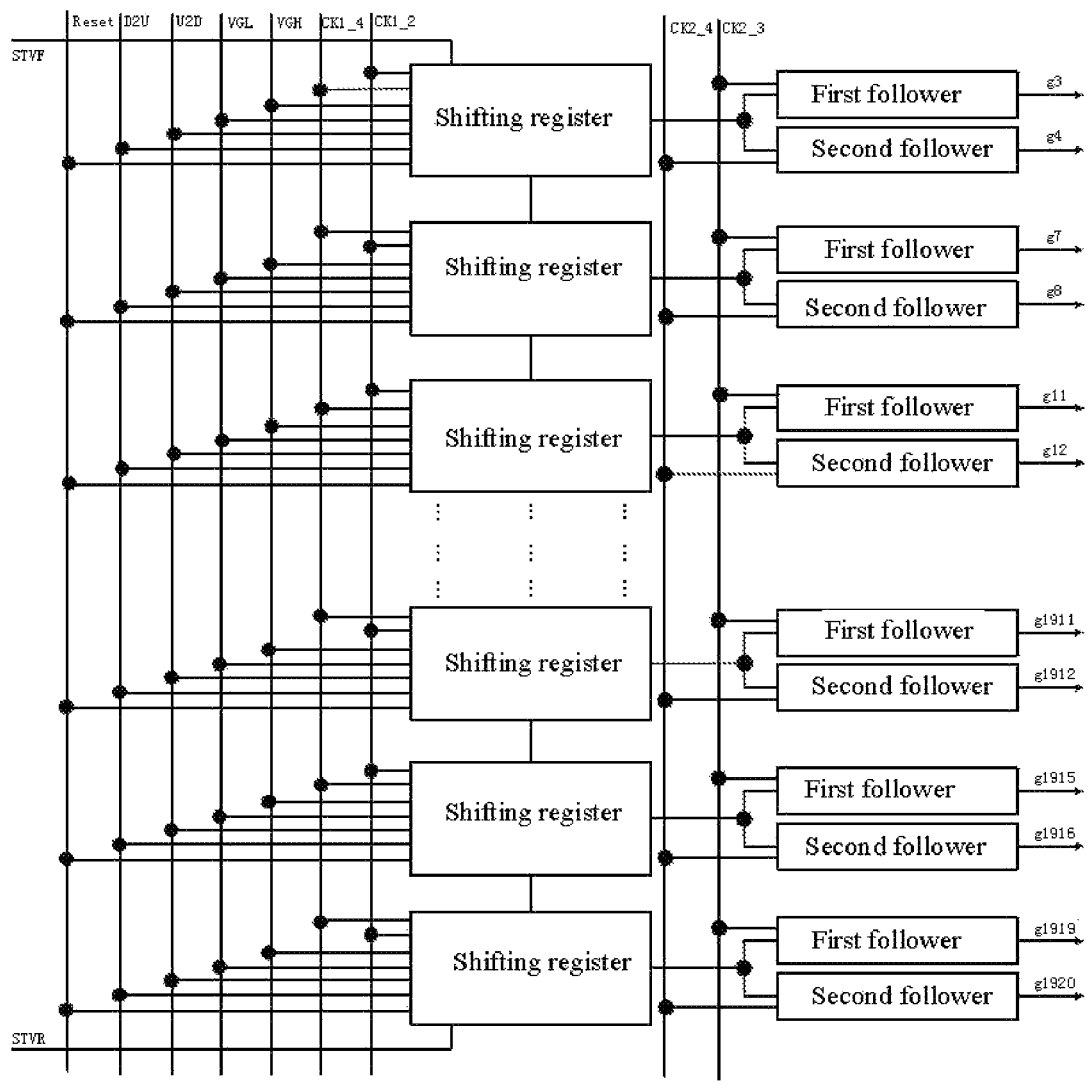
Figure 5:
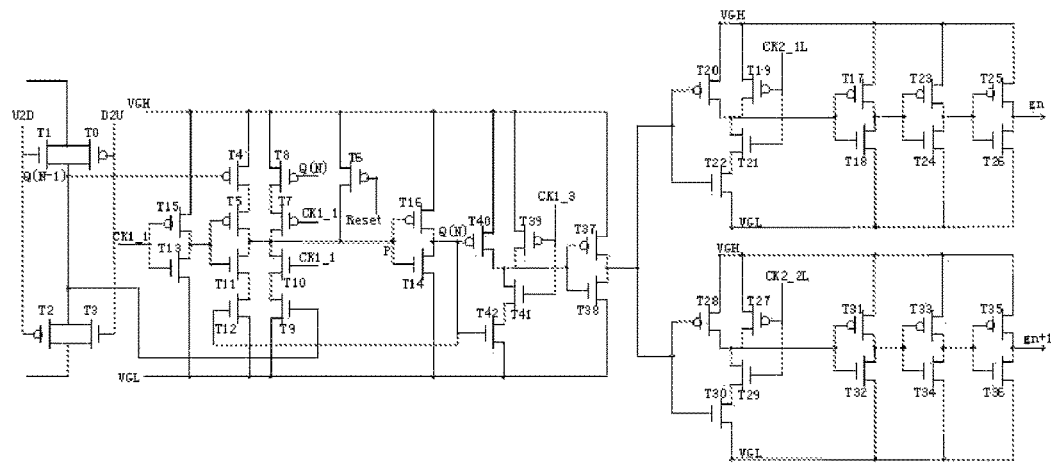
Figure 6:
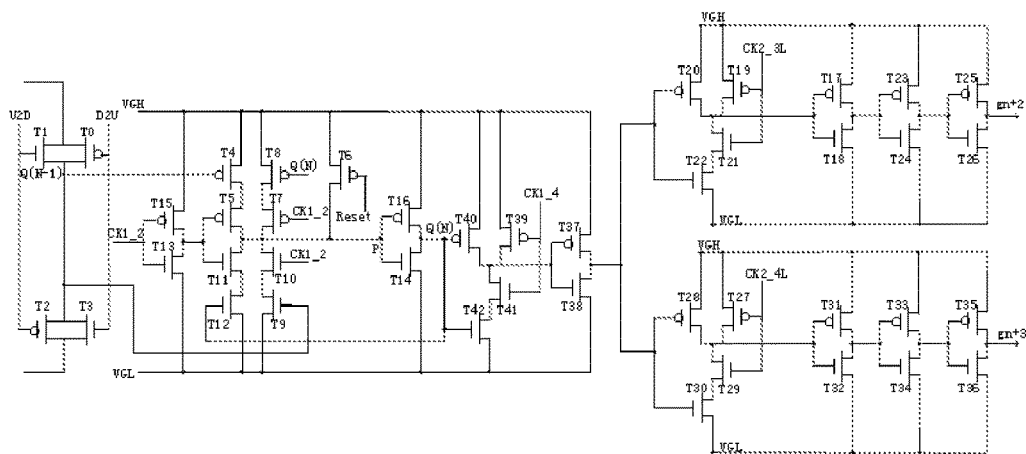
Figure 7:
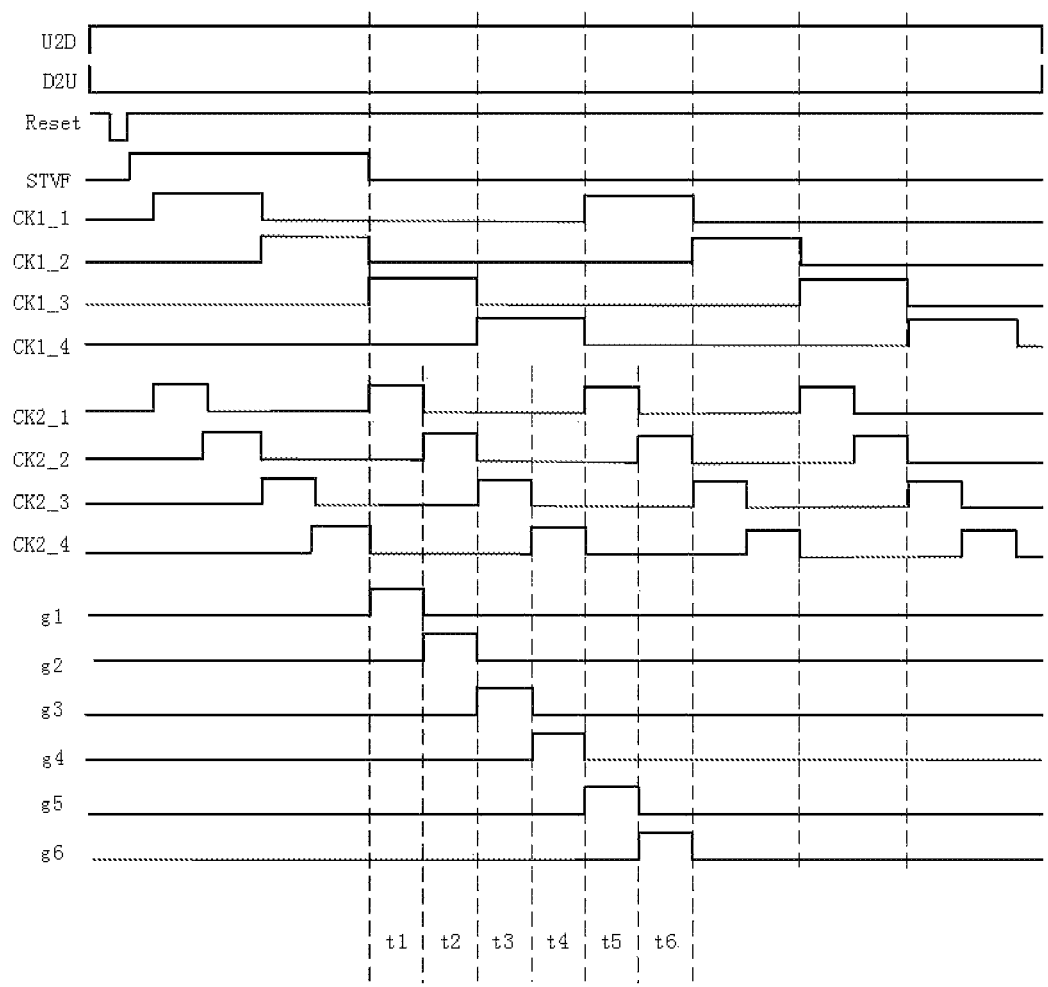

In order to illustrate the technical solutions of the examples of the present disclosure more clearly, the accompanying drawings needed for describing the examples will be explained briefly. In the drawings:

FIG. 1 schematically shows a gate drive circuit according to example 1 of the present disclosure, FIG. 2 schematically shows a display device according to example 2 of the present disclosure, FIG. 3 schematically shows a gate drive circuit on a left side of FIG. 2, FIG. 4 schematically shows a gate drive circuit on a right side of FIG. 2, FIG. 5 schematically shows a gate drive circuit in FIG. 3, FIG. 6 schematically shows a gate drive circuit in FIG. 4, and FIG. 7 shows a signal sequence diagram of the display device according to example 2 of the present disclosure.

DETAILED DESCRIPTION OF THE EMBODIMENTS

The present disclosure will be explained in detail with reference to the examples and the accompanying drawings, whereby it can be fully understood how to solve the technical problem by the technical means according to the present disclosure and achieve the technical effects thereof, and thus the technical solution according to the present disclosure can be implemented. It is important to note that as long as there is no structural conflict, all the technical features mentioned in all the examples may be combined together in any manner, and the technical solutions obtained in this manner all fall within the scope of the present disclosure.

Example 1

As shown in FIG. 1, the present disclosure provides a gate drive circuit, which can be formed in a peripheral region of an array substrate using GOA technology. The gate drive circuit comprises a shifting register, a first follower and a second follower.

In consecutive first scanning period and second scanning period, the shifting register outputs a primary drive signal into the first and the second followers.

In the first scanning period, the first follower is driven by the primary drive signal to output a gate drive signal to a first gate line; and in the second scanning period, the second follower is driven by the primary drive signal to output a gate drive signal to a second gate line.

In the gate drive circuit according to the present disclosure, the shifting register can output the primary drive signal in two continuous scanning periods. The first follower and the second follower can respectively output gate drive signals to corresponding gate lines under the driving of the primary drive signal. In this case, therefore, one gate drive circuit according to the present disclosure can drive two gate lines. The number of gate drive circuit can be significantly reduced according to the present disclosure as compared with the technical solution in the prior art of driving one gate line with one gate drive circuit, so that the width of a GOA circuit in a frame area of an array substrate can be reduced, whereby the width of a frame of the display device can be reduced.

Example 2

A display device is provided according to this example of the present disclosure, in particular an active display device, such as liquid crystal display device and OLED display device. The present is illustrated with a display screen of a cell phone. As shown in FIG. 2, a display area 10 is arranged in the middle of an array substrate of the display screen, and frame areas 20, namely GOA areas, are arranged on both sides of the display area.

Several cascaded gate drive circuits provided according to the above example 1 are formed in the frame areas for driving gate lines in the display area 10. In addition, the display in the present example is realized through an interlace driving mode, so that all gate drive circuits can be distributed evenly on both sides of the display area 10, thereby reducing a width of each frame area 20.

According to the present example, the display screen has a resolution of 1920×1080. FIG. 3 and FIG. 4 schematically show the cascade connection of each of the gate drive circuits respectively in the frame area on a left side of FIG. 2 and in the frame area on a right side thereof. It can be concluded that the display screen comprises totally 1920 gate lines.

FIG. 5 schematically shows a specific circuit diagram of a gate drive circuit in FIG. 3, and FIG. 6 schematically shows a specific circuit diagram of a gate drive circuit in FIG. 4. The gate drive circuit in the present example is formed by CMON technique. Gate drive circuits of NMOS (such as transistors T1 and T3) and PMOS (such as transistors T0 and T2) can be made using the characteristic of ultrahigh carrier mobility of low temperature poly-silicon (LTPS).

As shown in FIG. 5, the gate drive circuit comprises a shifting register, a first follower and a second follower. The shifting register mainly comprises a latch and an NAND gate circuit. VGH is a high level signal line and VGL is a low level signal line. In addition, to the latch is connected a first primary clock signal line and to the NAND gate circuit is connected a second primary clock signal line. For example, in the first gate drive circuit shown in FIG. 3, the latch is connected to CK1_1 and the NAND gate circuit is connected to CK1_3 (as shown in FIG. 5). For another example, in the second gate drive circuit shown in FIG. 3, the latch is connected to CK1_3 and the NAND gate circuit is connected to CK1_1. CK1_1 and CK1_3 both output pulse signals (see FIG. 7) having a phase difference of 180°.

As shown in FIG. 5, in the present example, the latch comprises NMOS transistors T9, T10, T11, T12, T13 and T14, and PMOS transistors T4, T5, T7, T8, T15 and T16. Gates of T7, T10, T13 and T15 are connected to CK1_1; gates of T4 and T9 are connected to a first trigger signal end Q(N−1); and gates of T8 and T12 are connected to an output end of the latch. A source of T13 is connected to VGL, a source of T15 is connected to VGH, and drains of T13 and T15 are connected to gates of T5 and T11. Sources of T4 and T8 are connected to VGH, a drain of T4 is connected to a source of T5, and a drain of T8 is connected to a source of T7. Sources of T9 and T12 are connected to VGL, a drain of T9 is connected to a source of T10, and a drain of T12 is connected to a source of T11. Drains of T5, T7, T10 and T11 are connected to gates of T14 and T16 at a point P. A source of T14 is connected to VGL, a source of T16 is connected to VGH, and drains of T14 and T16 are connected together as the output end of the latch.

Moreover, the latch further comprises PMOS transistor T6. A gate of T6 is connected to a reset signal line Reset, a source of T6 is connected to VGH, and a drain of T6 is connected to the gates of T14 and T16, i.e., point P.

As shown in FIG. 5, in the present example, the NAND gate circuit of the shifting register comprises NMOS transistors T41 and T42, and PMOS transistors T39 and T40. Gates of T39 and T41 are connected to CK1_3, gates of T40 and T42 are connected to the output end of the latch. A source of T42 is connected to VGL, a drain of T42 is connected to a source of T41, and a drain of T41 acts as an output end of the NAND gate circuit. Sources of T39 and T40 are connected to VGH, and drains of T39 and T40 are connected to the drain of T41.

Further, the shifting register further comprises an inverter disposed behind the NAND gate circuit. The inverter comprises NMOS transistor T38 and PMOS transistor T37. Gates of T37 and T38 are connected to the output end of the NAND gate circuit, a source of T37 is connected to VGH, a source of T38 is connected to VGL, drains of T37 and T38 are connected together as an output end of the shifting register.

Further, the shifting register further comprises a forward and reverse selective circuit. Different high levels and low levels can be outputted from a forward scan signal line U2D and a reverse scan signal line D2U, so that the forward and reverse selective circuit can selectively receive a first trigger signal from a previous stage of gate drive circuit or from a subsequent stage of gate drive circuit, whereby two scan modes, namely from top to bottom (forward scan) and from bottom to top (reverse scan), can be realized.

Specifically, the forward and reverse selective circuit comprises NMOS transistors T1 and T3, and PMOS transistors T0 and T2. Gates of T1 and T2 are connected to U2D, and gates of T0 and T3 are connected to D2U. Sources of T0 and T1 are connected to the output end of a previous stage of shifting register (if the previous stage of shifting register is the first stage, the sources of T0 and T1 are connected to a forward trigger signal line STVF); and sources of T2 and T3 are connected to a subsequent stage of shifting register (if the subsequent stage of shifting register is the last stage, the sources of T2 and T3 are connected to a reverse trigger signal line STVR). Drains of T0, T1, T2 and T3 are connected together, as an output end of the forward and reverse selective circuit.

According to the present example, the first follower comprises an NAND gate circuit and a buffer.

The NAND gate circuit of the first follower comprises NMOS transistors T21 and T22, and PMOS transistors T19 and T20. Gates of T19 and T21 are connected to a first secondary clock signal line CK2_1, and gates of T20 and T22 are connected to the output end of the shifting register. A source of T22 is connected to VGL, a drain of T22 is connected to a source of T21, and a drain of T21 acts as an output end of the NAND gate circuit. Sources of T19 and T20 are connected to VGH, and drains of T19 and T20 are connected to the drain of T21.

The buffer of the first follower comprises NMOS transistors T18, T24 and T26, and PMOS transistors T17, T23 and T25. Gates of T17 and T18 are connected to the output end of the NAND gate circuit, drains of T17 and T18 are connected to gates of T23 and T24, drains of T23 and T24 are connected to gates of T25 and T26, and drains of T25 and T26 are connected to a gate line gn. Sources of T17, T23 and T25 are connected to VGH, and sources of T18, T24 and T26 are connected to VGL.

According to the present example, the second follower also comprises an NAND gate circuit and a buffer.

The NAND gate circuit of the second follower comprises NMOS transistors T29 and T30, and PMOS transistors T27 and T28. Gates of T27 and T29 are connected to a second secondary clock signal line CK2_2, and gates of T28 and T30 are connected to the output end of the shifting register. A source of T30 is connected to VGL, a drain of T22 is connected to a source of T29, and a drain of T29 acts as an output end of the NAND gate circuit. Sources of T27 and T28 are connected to VGH, and drains of T27 and T28 are connected to the drain of T29.

The buffer of the second follower comprises NMOS transistors T32, T34 and T36, and PMOS transistors T31, T33 and T35. Gates of T31 and T32 are connected to the output end of the NAND gate circuit, drains of T31 and T32 are connected to gates of T33 and T34, drains of T33 and T34 are connected to gates of T35 and T36, and drains of T35 and T36 are connected to a gate line gn+1. Sources of T31, T33 and T35 are connected to VGH, and sources of T32, T34 and T36 are connected to VGL.

The gate drive circuit as shown in FIG. 6 comprises a shifting register, a first follower, a second follower, and a forward and reverse selective circuit. The specific circuit is basically the same as that shown in FIG. 5. The difference thereof lies in that to the latch thereof is connected a third primary clock signal line and to the NAND gate circuit thereof is connected a fourth clock signal line. For example, in the first gate drive circuit as shown in FIG. 4, the latch is connected to CK1_2 and the NAND gate circuit is connected to CK1_4 (see FIG. 6). For another example, in the second gate drive circuit as shown in FIG. 4, the latch is connected to CK1_4, and the NAND gate circuit is connected to CK1_2. CK1_2 and CK1_4 both output pulse signals (see FIG. 7) having a phase difference of 180°. The first follower and the second follower each comprise an NAND gate circuit and a buffer, specific components of which are basically the same as those shown in FIG. 5. The difference thereof lies in that to the first follower is connected a third secondary clock signal line CK2_3 and to the second follower is connected a fourth secondary clock signal line CK2_4.

The operation of a display device according to the present example is as follows.

As shown in FIG. 7, the present example is illustrated with forward scanning, in which U2D outputs high level all the time and D2U outputs low level all the time, so that T0 and T1 in each shifting register are switched on, and T2 and T3 therein are shutoff.

The Reset first outputs low level pulse which switches T6 of each shifting register on, with point P at high level, and which, after passing through an inverter comprising T14 and T16, maintains second trigger signal Q(N) in each shifting register at low level.

First, STVF outputs first trigger signal Q(0) to the first shifting register on a left side (and on a right side), so that T9 in the latch can be switched on. When CK1_1 outputs high level, T10 in the latch also is also switched on, so that point P is of low level. The first trigger signal passes through the inverter comprising T14 and T16, and then outputs as second trigger signal Q(1). In the case of reverse scanning, the first trigger signal is outputted from STVR.

Subsequently, in a first scanning period t1 and a second scanning period t2, CK1_1 outputs low level and CK1_3 outputs high level. The low level outputted from CK1_1 passes through an inverter comprising T13 and T15, so as to switch on T11 in the latch. At the same time, Q(1) switches T12 in the latch on, so that point P can be maintained at low level, whereby Q(1) can be outputted continuously. In the meantime, in the NAND gate circuit of the shifting register, T41 and T42 are switched on simultaneously. In other words, NAND operation is performed on CK1_3 and Q(1), so as to output low level which, after passing through an inverter comprising T37 and T38, is outputted as primary drive signal G(1). In other moments, at least one of CK1_3 and G(1) is of low level, so that at least one of T39 and T40 is switched on, but T41 and T42 cannot be switched on simultaneously. As a result, after NAND operation on CK1_3 and Q(1), high level is outputted, therefore, it is impossible to output G(1).

On the other hand, Q(1) of the moment is further inputted into a second shifting register, as first trigger signal thereof.

In t1, CK2_1 outputs high level. In the NAND gate circuit of the first follower, T21 and T22 are switched on simultaneously, that is, NAND operation is performed using CK2_1 and G(1), so that low level can be outputted. The buffer receives the low level, and outputs high level gate drive signal to the first gate line g1.

In t2, CK2_2 outputs high level. In the NAND gate circuit of the second follower, T29 and T30 are switched on simultaneously, that is, NAND operation is performed using CK2_2 and G(1), so that low level can be outputted. The buffer receives the low level, and outputs high level gate drive signal to the second gate line g2.

In a third scanning period t3 and a fourth scanning period t4, CK1_3 is of low level and the shifting register no longer outputs G(1). As a result, the gate drive circuit outputs low level to g1 and g2.

In each subsequent scanning period, Q(1) and Q(0) are of low level all the time, so that T4 and T8 are switched on. Since one of T5 and T7 is necessarily on (when CK1_1 is of high level, T5 is on; and when CK1_1 is of low level, T7 is on), point P can be locked at high level by the latch, so that Q(1) is no longer outputted, whereby g1 and g2 are maintained at low level.

In a fifth scanning period t5 and a sixth scanning period t6, the second gate drive circuit outputs gate drive signal respectively to a fifth gate line g5 and a sixth gate line g6. As a result, all gate lines can be driven in the same manner.

Operation of each gate drive circuit on the right side of the display area is the same as that on the left side thereof, except being delayed for two scanning periods in sequence, thus will not be described in detail.

GOA technology is used in the display device according to the present disclosure in which gate drive circuits are formed in frame areas of the array substrate thereof through CMOS process. According to an example of the present disclosure, a gate drive circuit can drive two gate lines. In the meantime, with the interlace driving mode, the gate drive circuits can be evenly distributed on both sides of the display area. Therefore, in a length direction, one gate drive circuit is equivalent to four gate lines in size. As compared with the technical solution in the prior art of driving one gate line with one gate drive circuit, a size of the gate drive circuit according to an example of the present disclosure in the length direction is increased to four times the original size thereof, but a size thereof in a width direction is decreased to a quarter of the original size thereof, so that the GOA circuit in the frame area of the array substrate can be significantly reduced, whereby a width of the frame of the display device can be reduced.

The above embodiments are described only for better understanding, rather than restricting, the present disclosure. Any person skilled in the art can make amendments to the implementing forms or details without departing from the spirit and scope of the present disclosure. The scope of the present disclosure should still be subjected to the scope defined in the claims.

The invention claimed is:

1. A gate drive circuit, comprising a shifting register, a first follower and a second follower, wherein
an output end of the shifting register is connected to input ends of the first follower and the second follower, respectively, an output end of the first follower is connected to a first gate line and an output end of the second follower is connected to a second gate line;
the shifting register comprises a latch and a first NAND gate circuit, wherein the latch is configured to receive a first trigger signal and output a second trigger signal before a first scanning period and a second scanning period start, and continuously output the second trigger signal in the first scanning period and the second scanning period, and the first NAND gate circuit is configured to be driven by the second trigger signal to output a primary drive signal into the first follower and the second follower in the first scanning period and the second scanning period;
the first follower comprises a second NAND gate circuit and a first buffer and is configured to be driven by the primary drive signal to output a first gate drive signal to the first gate line in the first scanning period; and
the second follower comprises a third NAND gate circuit and a second buffer and is configured to be driven by the primary drive signal to output a second gate drive signal to the second gate line in the second scanning period.

2. The gate drive circuit according to claim 1, wherein a first primary clock signal line is connected to the latch and a second primary clock signal line is connected to the first NAND gate circuit; and
the first primary clock signal line and the second primary clock signal line both output pulse signals having a phase difference of 180° therebetween.

3. The gate drive circuit according to claim 2, wherein the latch comprises NMOS transistors T9, T10, T11, T12, T13 and T14, and PMOS transistors T4, T5, T7, T8, T15 and T16, wherein
gates of T7, T10, T13, and T15 are connected to the first primary clock signal line, gates of T4 and T9 are connected to the first trigger signal, and gates of T8 and T12 are connected to an output end of the latch;
a source of T13 is connected to a low level signal line, a source of T15 is connected to a high level signal line, and drains of T13 and T15 are connected to gates of T5 and T11 respectively;
sources of T4 and T8 are connected to the high level signal line, a drain of T4 is connected to a source of T5, and a drain of T8 is connected to a source of T7;
sources of T9 and T12 are connected to the low level signal line, a drain of T9 is connected to a source of T10, and a drain of T12 is connected to a source of T11;

drains of T5, T7, T10 and T11 are connected to gates of T14 and T16 respectively; and
a source of T14 is connected to the low level signal line, a source of T16 is connected to the high level signal line, and drains of T14 and T16 are connected together to act as the output end of the latch.

4. The gate drive circuit according to claim 3, wherein the first NAND gate circuit comprises NMOS transistors T41 and T42, and PMOS transistors T39 and T40, wherein
gates of T39 and T41 are connected to the second primary clock signal line, and gates of T40 and T42 are connected to the output end of the latch;
a source of T42 is connected to the low level signal line, a drain of T42 is connected to a source of T41, and a drain of T41 acts as an output end of the first NAND gate circuit; and
sources of T39 and T40 are connected to the high level signal line, and drains of T39 and T40 are connected to the drain of T41.

5. The gate drive circuit according to claim 4, wherein the shifting register further comprises an inverter having an NMOS transistor T38 and a PMOS transistor T37, wherein gates of T37 and T38 are connected to the output end of the first NAND gate circuit, a source of T37 is connected to the high level signal line, a source of T38 is connected to the low level signal line, and drains of T37 and T38 are connected together to act as an output end of the shifting register.

6. The gate drive circuit according to claim 1, wherein the shifting register further comprises a forward and reverse selective circuit which is configured to receive the first trigger signal from a previous stage of gate drive circuit or from a subsequent stage of gate drive circuit to achieve a forward scan or a reverse scan.

7. The gate drive circuit according to claim 6, wherein the forward and reverse selective circuit comprises NMOS transistors T1 and T3, and PMOS transistors T0 and T2, wherein
gates of T1 and T2 are connected to a forward scan signal line, and gates of T0 and T3 are connected to a reverse scan signal line;
sources of T0 and T1 are connected to an output end of a previous stage of shifting register or a forward trigger signal line, and sources of T2 and T3 are connected to an output end of a subsequent stage of shifting register or a reverse trigger signal line; and
drains of T0, T1, T2 and T3 are connected together to act as an output of the forward and reverse selective circuit.

8. The gate drive circuit according to claim 1, wherein a first secondary clock signal line is connected to the first follower, and a second secondary clock signal line is connected to the second follower, wherein
the first secondary clock signal line is configured to output a high level in the first scanning period; and
the second secondary clock signal line is configured to output a high level in the second scanning period.

9. The gate drive circuit according to claim 8, wherein in the first scanning period, the second NAND gate circuit of the first follower performs an NAND operation on the high level outputted from the first secondary clock signal line and the primary drive signal, and outputs a low level; and
the first buffer of the first follower receives the low level, and outputs the first gate drive signal to the first gate line.

10. The gate drive circuit according to claim 9, wherein the second NAND gate circuit comprises NMOS transistors T21 and T22, and PMOS transistors T19 and T20, wherein
gates of T19 and T21 are connected to the first secondary clock signal line, and gates of T20 and T22 are connected to the output end of the shifting register;
a source of T22 is connected to a low level signal line, a drain of T22 is connected to a source of T21, and a drain of T21 acts as an output end of the second NAND gate circuit;
sources of T19 and T20 are connected to a high level signal line, and drains of T19 and T20 are connected to the drain of T21; and
the first buffer comprises NMOS transistors T18, T24 and T26, and PMOS transistors T17, T23 and T25, wherein
gates of T17 and T18 are connected to the output end of the second NAND gate circuit, drains of T17 and T18 are connected to gates of T23 and T24, drains of T23 and T24 are connected to gates of T25 and T26, and drains of T25 and T26 are connected to the first gate line; and
sources of T17, T23 and T25 are connected to the high level signal line, and sources of T18, T24 and T26 are connected to the low level signal line.

11. The gate drive circuit according to claim 8, wherein in the second scanning period, the third NAND gate circuit of the second follower performs an NAND operation on the high level outputted from the second secondary clock signal line and the primary drive signal, and outputs a low level; and
the second buffer of the second follower receives the low level, and outputs the second gate drive signal to the second gate line.

12. The gate drive circuit according to claim 11, wherein the third NAND gate circuit comprises NMOS transistors T29 and T30, and PMOS transistors T27 and T28, wherein
gates of T27 and T29 are connected to the second secondary clock signal line, and gates of T28 and T30 are connected to the output end of the shifting register;
a source of T30 is connected to a low level signal line, a drain of T30 is connected to a source of T29, and a drain of T29 acts as an output end of the third NAND gate circuit;
sources of T27 and T28 are connected to a high level signal line, and drains of T27 and T28 are connected to the drain of T29; and
the second buffer comprises NMOS transistors T32, T34 and T36, and PMOS transistors T31, T33 and T35, wherein
gates of T31 and T32 are connected to the output end of the third NAND gate circuit, drains of T31 and T32 are connected to gates of T33 and T34, drains of T33 and T34 are connected to gates of T35 and T36, and drains of T35 and T36 are connected to the second gate line; and
sources of T31, T33 and T35 are connected to the high level signal line, and sources of T32, T34 and T36 are connected to the low level signal line.

13. The gate drive circuit according to claim 1, wherein the gate drive circuit is a GOA gate drive circuit.

14. A display device, comprising several cascaded gate drive circuits, wherein the display device performs display by means of interlace driving; and
the gate drive circuit comprises a shifting register, a first follower and a second follower, wherein an output end of the shifting register is connected to input ends of the first follower and the second follower, respectively, an output end of the first follower is connected to a first gate line and an output end of the second follower is connected to a second gate line, wherein
the shifting register comprises a latch and a first NAND gate circuit, wherein the latch is configured to receive a first trigger signal and output a second trigger signal before a first scanning period and a second scanning period start, and continuously output the second trigger signal in the first scanning period and the second scanning period, and the first NAND gate circuit is configured to be driven by the second trigger signal to output a primary drive signal into the first follower and the second follower in the first scanning period and the second scanning period;
the first follower comprises a second NAND gate circuit and a first buffer and is configured to be driven by the primary drive signal to output a first gate drive signal to the first gate line in the first scanning period, and
the second follower comprises a third NAND gate circuit and a second buffer and is configured to be driven by the primary drive signal to output a second gate drive signal to the second gate line in the second scanning period.

* * * * *